United States Patent
Samala

(10) Patent No.: US 8,643,445 B1
(45) Date of Patent: Feb. 4, 2014

(54) CRYSTAL OSCILLATOR CIRCUIT

(75) Inventor: Sreekiran Samala, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 10 days.

(21) Appl. No.: 13/570,239

(22) Filed: Aug. 8, 2012

(51) Int. Cl.
    *H03L 5/00* (2006.01)
(52) U.S. Cl.
    USPC ... 331/183; 331/158; 331/116 R; 331/116 FE
(58) Field of Classification Search
    USPC .......................... 331/183, 158, 116 R, 116 FE
    See application file for complete search history.

(56) References Cited

U.S. PATENT DOCUMENTS 6,271,734 B1 * 8/2001 Satoh .......................... 331/109
7,859,355 B2 * 12/2010 Brennan et al. ............... 331/183

* cited by examiner

*Primary Examiner* — Arnold Kinkead
(74) *Attorney, Agent, or Firm* — John R. Pessetto; Wade J. Brady, III; Frederick J. Telecky, Jr.

(57) ABSTRACT

Oscillator circuits are disclosed herein. An embodiment of an oscillator circuit includes a first bias circuit and a second bias circuit. An oscillator first connection terminal is coupled to a node, wherein the node is coupled to the first bias circuit and the second bias circuit. An oscillator second connection terminal connected to the second bias circuit. An increase in the oscillation amplitude of the oscillator increases the current in the second bias circuit and causes a reduction in the bias current in the first bias circuit.

15 Claims, 2 Drawing Sheets

CRYSTAL OSCILLATOR CIRCUIT

BACKGROUND

Many crystal oscillator circuits require biasing, amplitude control, and negative resistance circuits, which are made from individual components. For example, the biasing circuit may have components that are independent from the components used by the negative resistance circuit. By having separate circuits performing different functions, the area and power consumption of the crystal oscillator circuits are relatively large.

The use of individual circuits requires coupling capacitors between many of the individual circuits. Flux capacitors are required in many of these coupling applications. One problem with the coupling circuits is that the flux capacitors are very large and may consume a relatively large portion of the area of the die. For example, in a specific implementation in a 130 nm CMOS process, a crystal oscillator on a die may have an area of approximately 0.07 mm². These crystal oscillators typically require at least three flux capacitors, which account for 0.03 mm² or almost half of the die area.

SUMMARY

Oscillator circuits are disclosed herein. An embodiment of an oscillator circuit includes a first bias circuit and a second bias circuit. An oscillator first connection terminal is coupled to a node, wherein the node is coupled to the first bias circuit and the second bias circuit. An oscillator second connection terminal is connected to the second bias circuit. An increase in the oscillation amplitude of the oscillator increases the current in the second bias circuit and causes a reduction in the bias current in the first bias circuit.

DETAILED DESCRIPTION

Figure 1:
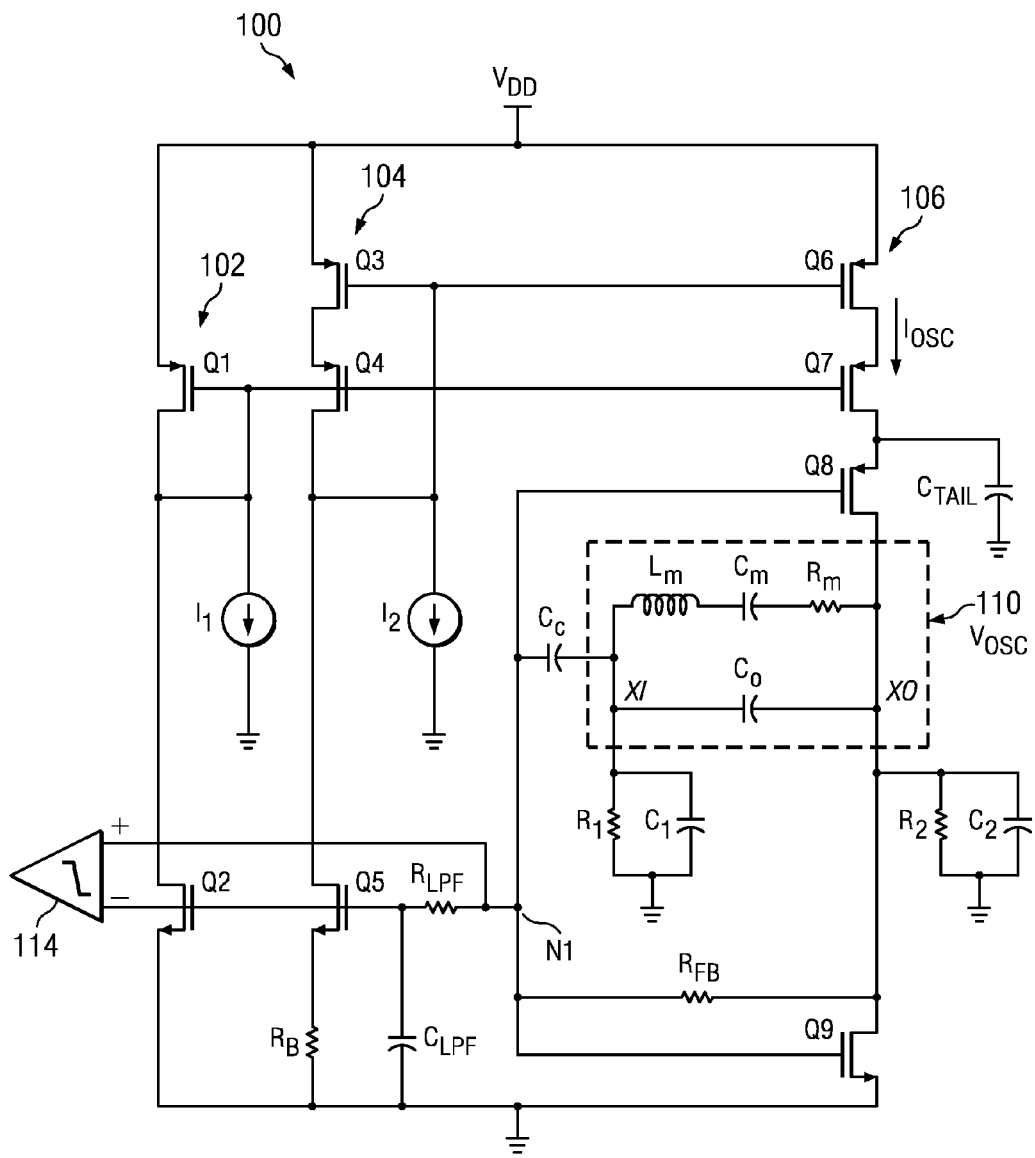
FIG. 1 is a schematic diagram of an embodiment of a crystal oscillator circuit.

Crystal oscillator circuits that require fewer components than conventional crystal oscillator circuits are described herein. Reference is made to FIG. 1, which is a schematic diagram of a crystal oscillator circuit 100. The crystal oscillator circuit 100 is sometimes referred to herein simply as the circuit 100. The circuit 100 provides an output signal at a specific frequency and a controlled amplitude. The circuit 100 may, as an example, be used as a clock signal for a processor.

The circuit 100 performs four basic functions that are required to generate the output signal. These four functions are, biasing, amplitude control, negative resistance, and compensation for a crystal. The components used for some of these functions overlap, meaning that a single component may serve more than one function. By having a single component serve more than one function, the number of components in the circuit 100 is reduced relative to conventional crystal oscillator circuits. The reduced number of components in the circuit 100 reduces the area required by the circuit 100. The individual components of the circuit 100 will be described followed by a description of the relation between the components and their functions.

The circuit 100 is powered by a DC voltage source $V_{DD}$, which is referenced to ground. Conventional oscillator circuits typically use four branches that all draw bias current from a common DC voltage source. The circuit 100 described herein only has three branches, which are described below. By using only three branches, the current draw on the voltage source $V_{DD}$ is much less than with conventional oscillator circuits.

A cascode branch 102 consists primarily of two FETs, Q1 and Q2, wherein FET Q1 is a p-channel FET and FET Q2 is an n-channel FET. It is to be understood that the FETs are examples of transistors that may be used with the oscillator 100 and that other types of transistors may be used in their place. The source of the FET Q1 is connected to the DC voltage source $V_{DD}$. The drain of the FET Q1 is connected to the drain of the FET Q2. The source of the FET Q2 is connected to ground. The gate and drain of the FET Q1 are connected to a current source 11 that is connected to ground. The current source 11 is a trickle current source that is used to start the oscillation. The current source 11 may sink approximately 1.25 nA. In the embodiment of the circuit 100 described herein, the FETs Q1 and Q2 have a bias current of approximately 10.0 nA, which is the bias current of the first branch. The first branch 102 forms cascode biasing for the other branches as described further below.

A second branch 104 consists primarily of three FETs, Q3, Q4, and Q5, wherein the FETs Q3 and Q4 are p-channel FETs and the FET Q5 is an n-channel FET. The source of the FET Q3 is connected to the DC voltage source $V_{DD}$. The drain of the FET Q3 is connected to the source of the FET Q4. The gate of the FET Q3 is connected to the drain of the FET Q4, which is also connected to a current source 12. The current source 12 may be substantially similar to the current source 11 and is a trickle current used to start the oscillation. The current source 12 may sink approximately 1.25 nA. The drain of the FET Q4 is connected to the drain of the FET Q5. The source of the FET Q5 is connected to ground through a bias resistor $R_B$, which may have a value of approximately 2MΩ. The second branch 104 may have a bias current of approximately 20.0 nA. The second branch 104 provides biasing and amplitude control of the output signal as described below.

The third branch 106 consists primarily of four FETs, Q6, Q7, Q8, and Q9. The FET Q6 is a p-channel FET that has its source connected to $V_{DD}$. The drain of the FET Q6 is connected to the source of the FET Q7, which is a p-channel FET. The drain of the FET Q7 is connected to the source of the FET Q8, which is a p-channel FET. The drain of the FET Q7 is also connected to ground by way of a tail capacitor $C_{TAIL}$, which may be a poly-nwell capacitor with a value of approximately 25.0 pF. The drain of the FET Q8 is connected to the drain of the FET Q9, which is an n-channel FET. The source of the FET Q9 is connected to ground. The gate of the FET Q8 is connected to the gate of the FET Q9, wherein this connection point is referred to as node N1. The node N1 is connected to the drain of the FET Q9 by way of a feedback resistor $R_{FB}$. The resistor $R_{FB}$ may have a value of approximately 50 MΩ. The third branch 106 may have a bias current of approximately 40.0 nA. The third branch 106 serves primarily as a negative resistance as described below.

A crystal oscillator device 110, sometimes referred to herein simply as the crystal 110, is connectable between contacts XI and XO. The crystal 110 may be an external device that is electrically connected to the circuit 100. The contact XO is connected to the drain of the FET Q8 and the drain of the FET Q9. The contact XI is connected to the node N1 by way of a coupling capacitor $C_c$, which is the only coupling capacitor in the circuit 100. The coupling capacitor $C_c$ may be a flux capacitor having a value of approximately 4.0 pF. The crystal 110 is electronically represented by the inductor Lm, the capacitor Cm, the resistor Rm and the capacitor $C_o$ as is well-known in the art. The inductor Lm and the capacitor Cm determine the frequency of the crystal 110. The resistor Rm represents the loss in the crystal 110 and the capacitor Co represents the stray capacitance in the crystal 110.

An effective resistance R1 and capacitance C1 are connected in parallel between the crystal input XI and ground. Similarly, an effective resistance R2 and capacitance C2 are connected in parallel between the crystal output XO and ground. The capacitances C1 and C2 represent load capacitance for the crystal 110. The resistances R1 and R2 represent losses of the crystal 114 during mounting to a substrate on which the circuit 100 may be formed.

The output of the circuit 100 is provided by an operational amplifier (op amp) 114 that is configured as a comparator. The op amp 114 has a non-inverting input that is connected to the node N1. Thus, the non-inverting input of the op amp 114 is also connected to the gates of the FETs Q8 and Q9. The inverting input of the op amp 114 is connected to the gates of the FETs Q2 and Q5. The inverting and non-inverting inputs of the op amp 114 are connected together by a resistor $R_{LPF}$, which may have a value of approximately 2.5MΩ. The inverting input of the op amp 114 is also connected to ground by way of a capacitor $C_{LPF}$, which may have a value of approximately 15 pF.

As shown by the schematic diagram of FIG. 1, the three branches 102, 104, 106 are interconnected. The gate of the FET Q3 is connected to the gate of the FET Q6, which are both connected to the trickle current source 12. The gates of the FETs Q1, Q4, and Q7 are connected together and to the trickle current source 11. The node NI provides a connection point between the op amp 114, the second branch 104, the third branch 106, and the crystal 110.

Having described the components of the circuit 100, its operation will now be described. The FETs Q3, Q5, Q6 and Q9 along with the bias resistor $R_B$ form proportional to absolute temperature (PTAT) bias current generation circuits. The bias current $I_{BIAS}$ in the second branch 104 is defined as follows:

$$I_{BIAS} = V_t \ln\left[\frac{\frac{(Id\_Q6)(Id\_Q5)}{(Id\_Q3)(Id\_Q9)}}{R_B}\right] \quad \text{Equation (1)}$$

where $V_t$ is the thermal voltage and the I_d references refer to the drive strengths of the associated FETs. For example, Id_Q5 refers to the drive strength of the FET Q5. The FETs Q1, Q2, Q4, and Q7 form cascode bias circuits with the PTAT bias generation circuits. The bias circuits bias approximately 10.0 nA in the first branch, 20.0 nA in the second branch 104, and 40.0 nA in the third branch 106.

The bias current in the second branch 104 serves to set the voltage at the inverting input to the op amp 114. More specifically, the voltage at the inverting input to the op amp 114 is equal to the voltage across the resistor $R_B$ plus the source to gate voltage on the FET Q5. A higher current in the second branch 104 will increase the voltage across the resistor $R_B$, which increases the voltage on the inverting input to the op amp 114.

The FETs Q8 and Q9 generate negative resistance to cancel the losses in the crystal 114. More specifically, the FETs Q6 and Q7 bias current through the FETs Q8 and Q9, which generate the negative resistance to cancel the losses in the crystal 110. The use of the negative resistance serves to cancel the losses in the crystal 100 and associated components in order to maintain resonance of the crystal 110 during oscillation. The negative resistance properties of the FETs Q8 and Q9 increase voltage as the current decreases. The resistor $R_{FB}$ serves to maintain the voltage on the gates of the FETs Q8 and Q9. As shown in FIG. 1, the terminal XI of the crystal 110 is connected to the negative resistance circuit (the FETs Q8 and Q9) by way of the coupling capacitor $C_c$.

Having described some of the operation of some of the components of the circuit 100, its overall operation will now be described. A voltage is applied to the crystal 100, which causes it to generate an oscillating voltage at the terminal X1. Internal losses in the crystal 110 will dampen the oscillations, so the negative resistance of the FETs Q8 and Q9 cancel the internal losses of the crystal 110 and enable it to oscillate.

Figure 2:
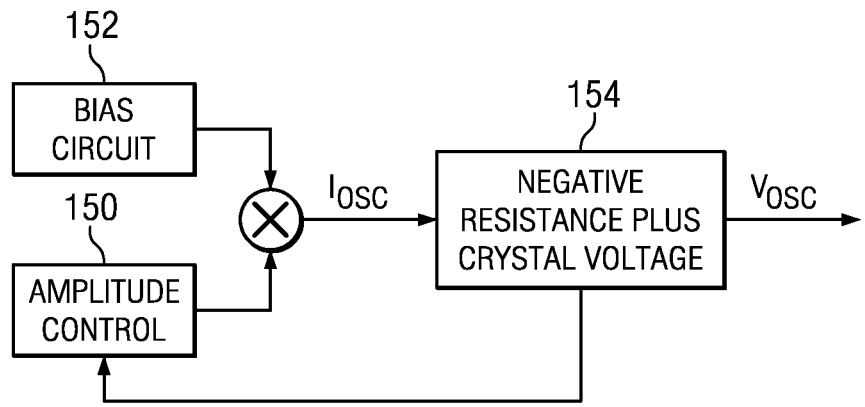
FIG. 2 is a block diagram describing the amplitude control in the circuit of FIG. 1.

A block diagram of the amplitude control is shown in FIG. 2. Amplitude control of the output is maintained by a loop of the coupling capacitor $C_c$, the filter $R_{LPF}$ and $C_{LPF}$, the FET Q5 with the bias resistor $R_B$, and the FETs Q3, Q6, and Q9. More specifically, as the oscillation amplitude at node N1 increases, the average drive strength of the FET Q9 increases, which reduces the ratio of drive strength of the FET Q5 to the FET Q9. When the ratio is reduced, bias current 152 in the second branch 104 decreases according to equation (1), which reduces the voltage on the inverting input of the op amp 114. It follows that the amplitude of the output is reduced and the oscillation amplitude is stabilized. It is noted that the amplitude control 150 is a two pole system that is dominated by the time constant of the crystal 110.

The current in the third branch 106, $I_{OSC}$, passes through the negative resistance 154 of the FETs Q8 and Q9, which generates a voltage $V_{OSC}$ at the node N1. Because the FETs Q8 and Q9 form a negative resistance 154, an increase in the current $I_{OSC}$ will decrease the voltage $V_{OSC}$. The voltage is fed back through the amplitude control circuit 150 described above, which will decrease the bias current 152 in the branch 104 and decrease the voltage on the non-inverting input of the op amp 114. The feedback from Q3 to Q6 will reduce the current $I_{OSC}$, which will cause stabilization of the output voltage.

Figure 3:
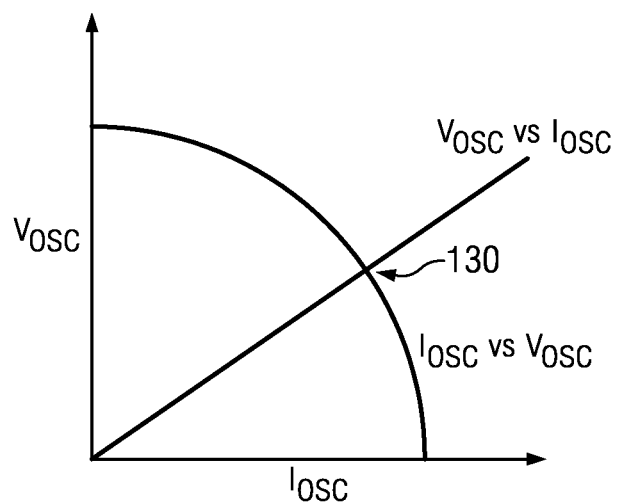
FIG. 3 is a graph depicting an operating voltage and current of the circuit of FIG. 1.

The operating point of the circuit 100, and specifically, the voltage $V_{OSC}$ and the current $I_{OSC}$ are shown in the graph of FIG. 3. The stable operating point is where the current $I_{OSC}$ plotted against the voltage $V_{OSC}$ is equal. More specifically, the linear relation of the graph is provided by voltage at the node N1 versus the current through the third branch 106. The logarithmic function is provided by the voltage and current generated by $R_B$, and the FETs Q5, Q3, Q6, and Q9. The intersection of these graphs is the operating point of the circuit 100.

The circuit 100 described herein has many advantages over conventional crystal oscillator circuits. One advantage is that the input to the output amplifier, the op amp 114, is internally biased. Therefore, a coupling capacitor is not required, which significantly reduces the size of the circuit 100 relative to conventional crystal oscillator circuits. Many conventional crystal oscillator circuits include a fourth branch to drive a FET similar to the FET Q9. This fourth branch requires a coupling capacitor and bias current. By eliminating this fourth branch, the circuit 100 does not require the area of the coupling capacitor or the additional power requirements of operating a fourth branch.

While illustrative and presently preferred embodiments of the invention have been described in detail herein, it is to be understood that the inventive concepts may be otherwise variously embodied and employed and that the appended claims are intended to be construed to include such variations except insofar as limited by the prior art.

What is claimed is:

1. An oscillator circuit comprising:
   a first bias circuit;
   a second bias circuit;
   an oscillator first connection terminal coupled to a node, wherein the node is coupled to the first bias circuit and the second bias circuit;
   an amplifier having an inverting input and a non-inverting input wherein the non-inverting input is connected to the node and wherein the voltage on the inverting input is proportional to the current in the first bias circuit;
   an oscillator second connection terminal connected to the second bias circuit; and
   wherein an increase in the oscillation amplitude of the oscillator increases the current in the second bias circuit and causes a reduction in the bias current in the first bias circuit.

2. The circuit of claim 1, wherein the non-inverting input of the amplifier is DC coupled to the node.

3. An oscillator circuit comprising:
   a first bias circuit;
   a second bias circuit;
   an oscillator first connection terminal coupled to a node, wherein the node is coupled to the first bias circuit and the second bias circuit;
   an oscillator second connection terminal connected to the second bias circuit; and
   wherein an increase in the oscillation amplitude of the oscillator increases the current in the second bias circuit and causes a reduction in the bias current in the first bias circuit;
   wherein the first bias circuit comprises:
      a first transistor;
      a second transistor connected in series with the first transistor, wherein the first transistor and the second transistor are of the same polarity; and
      a third transistor connected in series with the second transistor, wherein the third transistor has the opposite polarity as the second transistor.

4. The circuit of claim 3 and further comprising a bias resistor connected between the third transistor and a voltage node.

5. The circuit of claim 3 wherein the gate of the third transistor is connected to an output amplifier.

6. The circuit of claim 5, wherein the output amplifier is an operational amplifier, wherein the gate of the third transistor is connected to the inverting input of the operational amplifier, and wherein the non-inverting input of the operational amplifier is connected to the node.

7. An oscillator circuit comprising:
   a first bias circuit;
   a second bias circuit;
   an oscillator first connection terminal coupled to a node, wherein the node is coupled to the first bias circuit and the second bias circuit;
   an oscillator second connection terminal connected to the second bias circuit; and
   wherein an increase in the oscillation amplitude of the oscillator increases the current in the second bias circuit and causes a reduction in the bias current in the first bias circuit;
   wherein the second bias circuit comprises:
      a first transistor and a second transistor, wherein the drains and gates of the first and second transistors are connected together; and
      a first terminal wherein a crystal is connectable to the first terminal;
   wherein the first and second transistors form a negative resistance relative to a connected crystal.

8. The circuit of claim 7, wherein the gates of the first and second transistors are connected to the node.

9. The circuit of claim 7 and further comprising a feedback resistor connected between the drains and gates of the first and second transistors.

10. The circuit of claim 7 and further comprising a second terminal that is coupled by way of a capacitor to the node, and wherein the crystal is connectable to the second terminal.

11. The circuit of claim 7 and further comprising a third transistor and a fourth transistor, wherein the third and fourth transistors drive current into the first and second transistors.

12. The circuit of claim 11, wherein the first bias circuit has transistors and wherein the gates of the third and fourth transistors of the second bias circuit are connected to the gates of the transistors in the first bias circuit.

13. An oscillator circuit comprising:
    a current biasing circuit;
    a negative resistance circuit;
    a first terminal and a second terminal, wherein a crystal is connectable between the first terminal and the second terminal, the first terminal being directly connected to the negative resistance circuit and the second terminal being connected to the negative resistance circuit by way of a coupling capacitor, and wherein the coupling capacitor is the only coupling capacitor in the circuit;
    a node, wherein the negative resistance circuit is directly connected to the node; and wherein the biasing circuit is coupled to the node; and
    an output amplifier connected between the node and the biasing circuit;
    wherein the current biasing circuit comprises a first transistor and wherein the negative resistance circuit comprises a second transistor, wherein the gate of the first transistor is connected to the gate of the second transistor.

14. The circuit of claim 13, wherein the first transistor controls the current through the second transistor, and wherein the current through the second transistor is inversely proportional to the voltage generated by the negative resistance circuit.

15. An oscillator circuit comprising:
    a first bias circuit comprising:
       a first transistor connected to a first voltage node, a second transistor, and a third transistor, wherein the drains and sources of the first, second, and third transistors are connected in series; and
       a resistor connected between the third transistor and a second voltage node;
    a second bias circuit comprising:
       a fourth transistor connected to the first voltage node, a fifth transistor, sixth transistor, and a seventh transistor connected to the second voltage node, wherein the drains and sources of the fourth, fifth, sixth, and seventh transistors are connected in series;
    a third node connected to the gates of the sixth and seventh transistors;
    an output amplifier having an inverting input and a non-inverting input, wherein the inverting input is connected to the gate of the third transistor and the non-inverting gate is connected to the third node.

* * * * *